United States Patent
Deisch (10) Patent No.: US 7,262,948 B2
(45) Date of Patent: Aug. 28, 2007

(54) POWER SWITCH WITH SIMPLE OVERLOAD PROTECTION

(75) Inventor: Cecil W. Deisch, Warrenville, IL (US)

(73) Assignee: Tellabs Operations, Inc., Naperville, IL (US)

( * ) Notice: Subject to any disclaimer, the term of this patent is extended or adjusted under 35 U.S.C. 154(b) by 0 days.

(21) Appl. No.: 11/323,983

(22) Filed: Dec. 30, 2005

(65) Prior Publication Data

US 2007/0127181 A1    Jun. 7, 2007

Related U.S. Application Data

(60) Provisional application No. 60/741,590, filed on Dec. 2, 2005.

(51) Int. Cl.
*H02H 9/08* (2006.01)
*H02H 3/00* (2006.01)

(52) U.S. Cl. .................................... 361/93.9; 361/87

(58) Field of Classification Search ................ 361/93.9
See application file for complete search history.

(56) References Cited

U.S. PATENT DOCUMENTS

| | | | |
|---|---|---|---|
| 3,678,408 A | 7/1972 | Suzuki | |
| 4,853,820 A | 8/1989 | Ham, Jr. et al. | |
| 5,006,949 A | 4/1991 | Guajardo | |
| 5,324,989 A | 6/1994 | Thornton | |
| 5,444,590 A | 8/1995 | LeComte et al. | |
| 5,497,072 A | 3/1996 | LeComte et al. | |
| 5,914,545 A | 6/1999 | Pollersbeck | |
| 5,994,885 A | 11/1999 | Wilcox et al. | |
| 6,130,528 A | 10/2000 | Aoyama | |
| 6,175,220 B1 | 1/2001 | Billig et al. | |
| 7,031,130 B2* | 4/2006 | Simonelli et al. | 361/93.1 |
| 2003/0067340 A1 | 4/2003 | Watanabe | |
| 2003/0155899 A1 | 8/2003 | Oglesbee et al. | |

* cited by examiner

*Primary Examiner*—Stephen W. Jackson
*Assistant Examiner*—Dharti H. Patel
(74) *Attorney, Agent, or Firm*—Hamilton, Brook, Smith & Reynolds, P.C.

(57) ABSTRACT

A system provides overload protection in power-switching circuitry, whereby current through a switch is controlled by adaptive circuitry. The switch, configured to deliver a current and a voltage, is connected to two current-limiting feedback circuits. The first current-limiting feedback circuit is coupled to the switch and limits the current through the switch based on current measured through the switch. The second current-limiting feedback circuit is configured to shunt current around the first current-limiting feedback circuit as a function of the voltage delivered to the load, which changes the amount of current the switch can deliver to the load.

20 Claims, 7 Drawing Sheets

POWER SWITCH WITH SIMPLE OVERLOAD PROTECTION

RELATED APPLICATION

This application claims the benefit of U.S. Provisional Application No. 60/741,590, filed on Dec. 2, 2005. The entire teachings of the above application are incorporated herein by reference.

BACKGROUND OF THE INVENTION

There is often a need to connect and disconnect a load from a fixed voltage supply under electronic control. Solid state electronics have been used to perform the switching. Solid state electronics, however, may have current limits that can be exceeded in the case of a short or a low resistance load. In such cases, overload protection (i.e., current limiting) can be useful to protect the solid state electronics.

SUMMARY OF THE INVENTION

Embodiments of the present invention provide a system for overload protection in power-switching circuitry. In one embodiment, the system comprises a switch, configured to deliver a current and a voltage, and first and second current-limiting feedback circuits. The first current-limiting feedback circuit is coupled to the switch and limits the current through the switch based on current measured through the switch. The second current-limiting feedback circuit is configured to shunt at least some current around the first current-limiting feedback circuit as a function of the voltage delivered to the load. By shunting at least some current, the second current-limiting feedback circuit changes the amount of current the switch can deliver to the load.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1A:
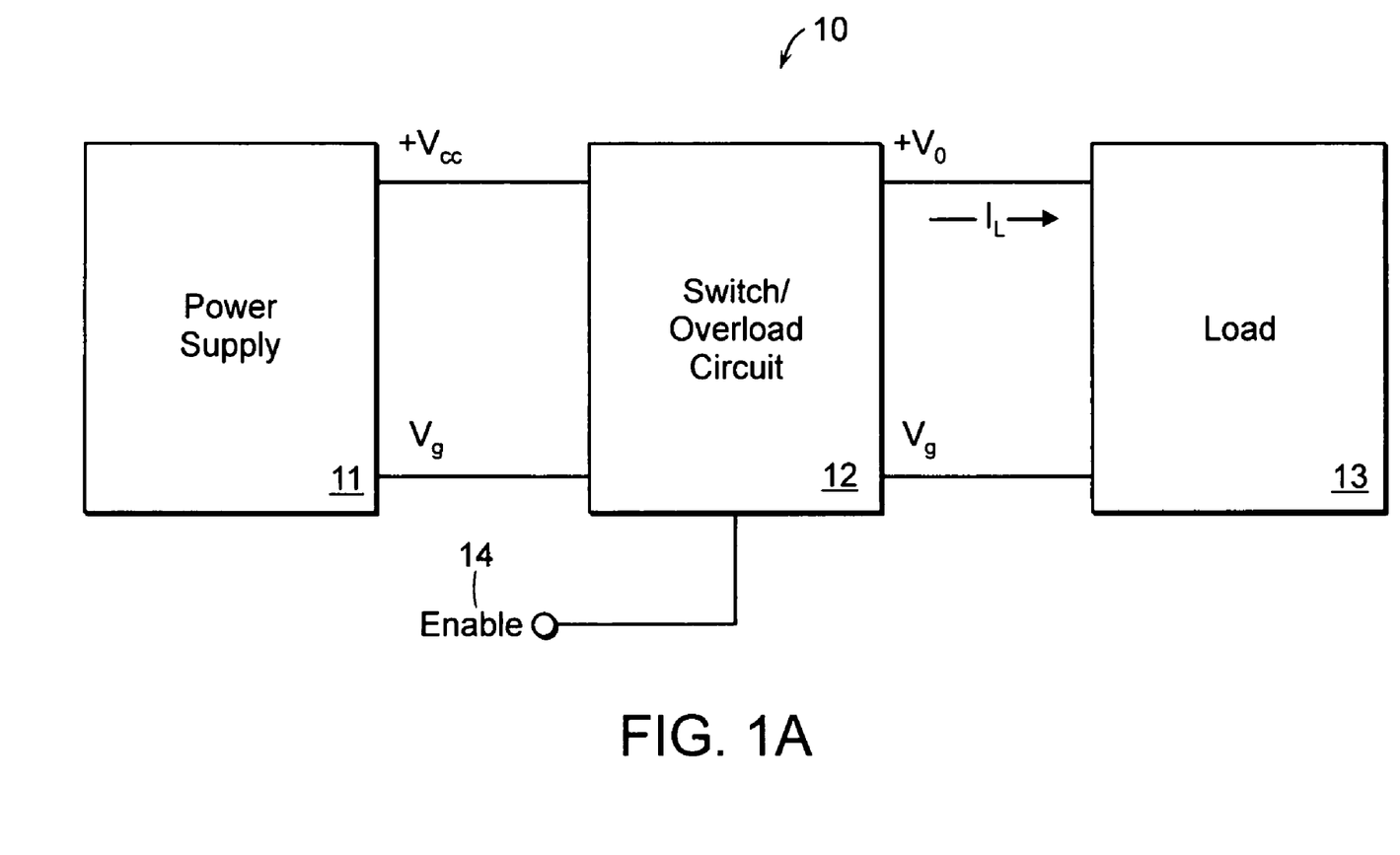
FIG. 1A is a block diagram of a system for connecting and disconnecting a power source to and from a load.

FIG. 1A illustrates an exemplary system 10 for connecting and disconnecting a power source 11 to and from a load 13 via a switch/overload circuit 12. The switch/overload circuit 12 receives power from the power source 11 through connection lines +Vcc and Vg. The load 13 may be connected to the switch/overload circuit 12 at connection lines +Vo and Vg, and an output current $I_L$ at +Vo is controlled by an "enable" signal 14. When the enable signal 14 is in an ON state, the output current $I_L$ flows to the load 13 at a voltage at node +Vo, as designated by the switch/overload circuit 12. When the enable signal 14 is in an OFF state, the switch/overload circuit 12 prevents the output current $I_L$ from flowing to the load 13.

Figure 1B:
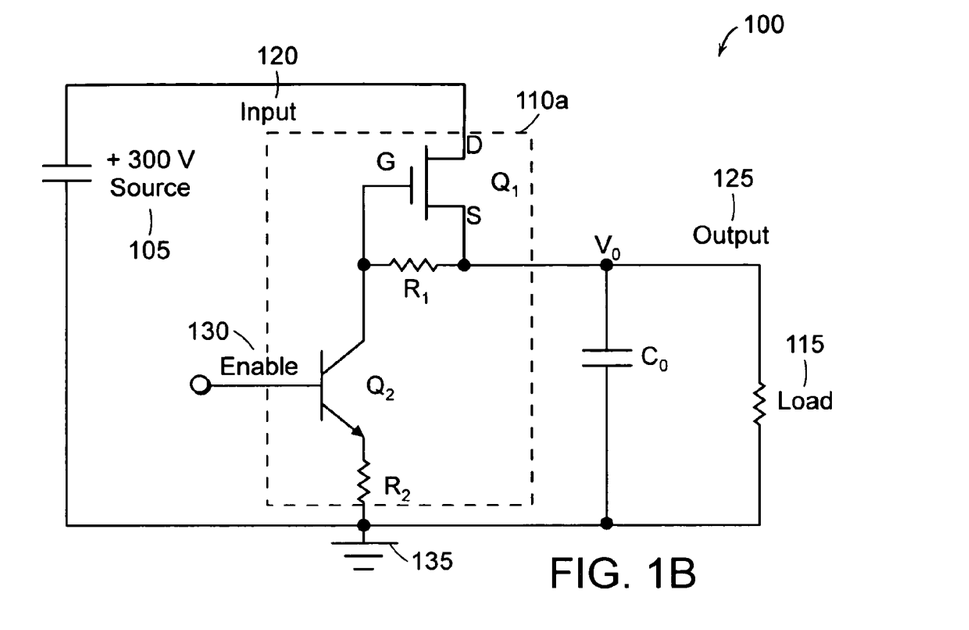
FIG. 1B is a schematic diagram of a circuit for connecting and disconnecting a power source to and from a load.

FIG. 1B illustrates a power delivery system 100 that employs a basic circuit 110a for connecting and disconnecting a load 115 to and from a fixed voltage supply 105 under electronic control, as generally described in reference to FIG. 1A. When the "enable" input 130 goes low, transistor Q2 turns off, which allows the gate-to-source voltage of switch Q1 to go to zero. In this circuit, switch Q1 is a depletion-mode N-channel Field Effect Transistor (FET), which has an advantageous property that Q1 is ON (i.e., in a 'closed' state) when its gate-to-source voltage is zero (in contrast to a more commonly known enhancement-mode N-channel FET that is OFF, i.e., in an 'open' state, when its gate-to-source voltage is zero). In this example, a 300 volt input 120 is applied to the load 115 via switch Q1, and capacitor Co is an output filter, which prevent an instantaneous voltage jump at the load 115. The example circuit 110a of FIG. 1B has a number of desirable properties, such as a minimal voltage drop from Input 120 to Output 125, and negligible current drain when the switch Q1 is activated.

When the enable input 130 to transistor Q2 goes high, Q2 turns ON and pulls its collector toward ground, allowing current to flow across resistor R1, from Q1 source to Q1 gate, setting the gate source voltage according to the voltage divider of resistors R1 and R2. Because approximately 3 volts of reverse gate-to-source voltage is required to turn switch Q1 off, the output voltage Vo 125 maintains a safe 3-5 volts above a voltage level of ground 135 (i.e., 0 V).

It should be understood that Q1 can alternatively be an enhancement-mode FET, in which case minor circuit differences as understood in the art (e.g., pull-up resistors) are employed to activate the switching properties for the switch Q1 to connect and disconnect the fixed voltage supply 105 to and from the load 115.

Occasionally, there may be a short or overload on the output at the load 115 that may damage switch Q1, so an overload protection circuit may be advantageous.

Figure 1C:
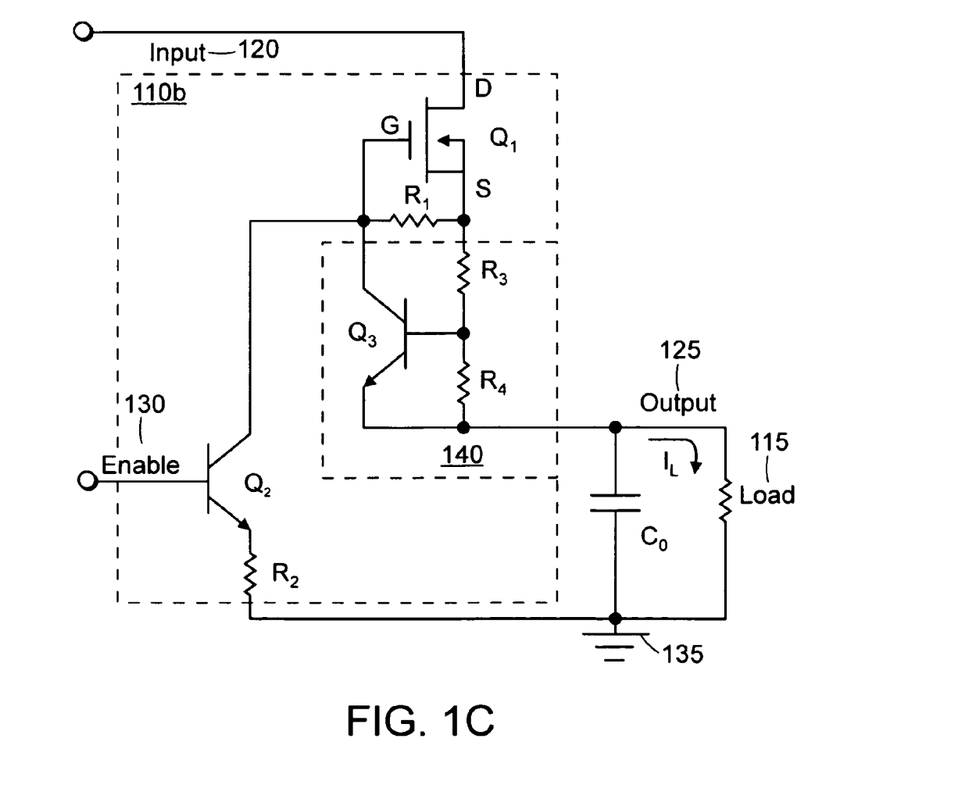
FIG. 1C is a schematic diagram of a circuit with basic overload protection.

FIG. 1C illustrates the circuit 10b of FIG. 1B with the addition of a basic overload protection circuit 140, including resistors R3 and R4 and transistor Q3. In this example circuit 110b, the entire load current $I_L$ flows through resistors R3 and R4. When the load current IL through resistor R4 reaches a high level, the base-to-emitter voltage of transistor Q3 increases to a threshold (approximately 0.7 V at room temperature), enough to turn transistor Q3 ON. Because the gate of switch Q1 must be at least 3 volts below its source to turn off the switch Q1 drain-source current path, additional voltage across R3 provides adequate voltage such that when transistor Q3 turns ON for an overload, the gate of Q1 is pulled far enough negative to limit the current through switch Q1 to a safe level.

Although simple, the protection circuit 110b of FIG. 1C has several problems. For example, switch Q1 may require limited power dissipation to prevent damage to the circuit 110b. For example, if the power dissipation of switch Q1 must be limited to 1.5 Watts (W), then, when the output 125 is shorted to ground 135, current through switch Q1 must be limited to 5 mA for a 300 volt voltage drop across the switch Q1. This limitation can be accomplished by selecting values of resistors R3 and R4 at 700 ohms and 140 ohms, respectively. Thus, if there is a sustained short, transistor Q3 turns on enough to reverse the bias of the voltage on the gate of Q1, limiting the output current to approximately 5 mA. However, if the current drain of the normal load 115 is a higher value, such as 10 mA, this circuit 110b prevents the output 125 from reaching the full 300 volts desired. Even if the load 115 is 5 mA or less, there is still nearly a 4-volt drop from input 120 to output 125. Additionally, because the filter Co must be charged, this 5 mA current limit slows the output 125 turn-on time.

An adaptive overload circuit may be useful to ensure ideal performance at the output. Such a circuit may 1) limit the maximum continuous power dissipation of switch Q1 to 1.5 watts or less, regardless of the overload; 2) quickly charge the load capacitance Co; 3) allow momentary overloads much higher than 1.5 W in switch Q1; and 4) have minimal voltage drop from input to output under normal operation.

The voltage across switch Q1 is inversely proportional to the current that may flow through it and maintain a 1.5 W dissipation in switch Q1. Thus, if the output 125 is shorted and there is a 300 volts voltage drop across switch Q1, switch Q1 can safely pass only 5 mA. If the output overload allows an output voltage of 100 volts (i.e., 200 volts voltage drop across switch Q1), switch Q1 can safely pass 7.5 mA. Likewise, if the overload allows an output voltage of 200 volts (i.e., 100 volts voltage drop across switch Q1), switch Q1 can safely pass 15 mA. At full output voltage of 300 volts (i.e., negligible voltage drop across switch Q1), switch Q1 can safely pass very high currents, limited only by its ON resistance.

Figure 2:
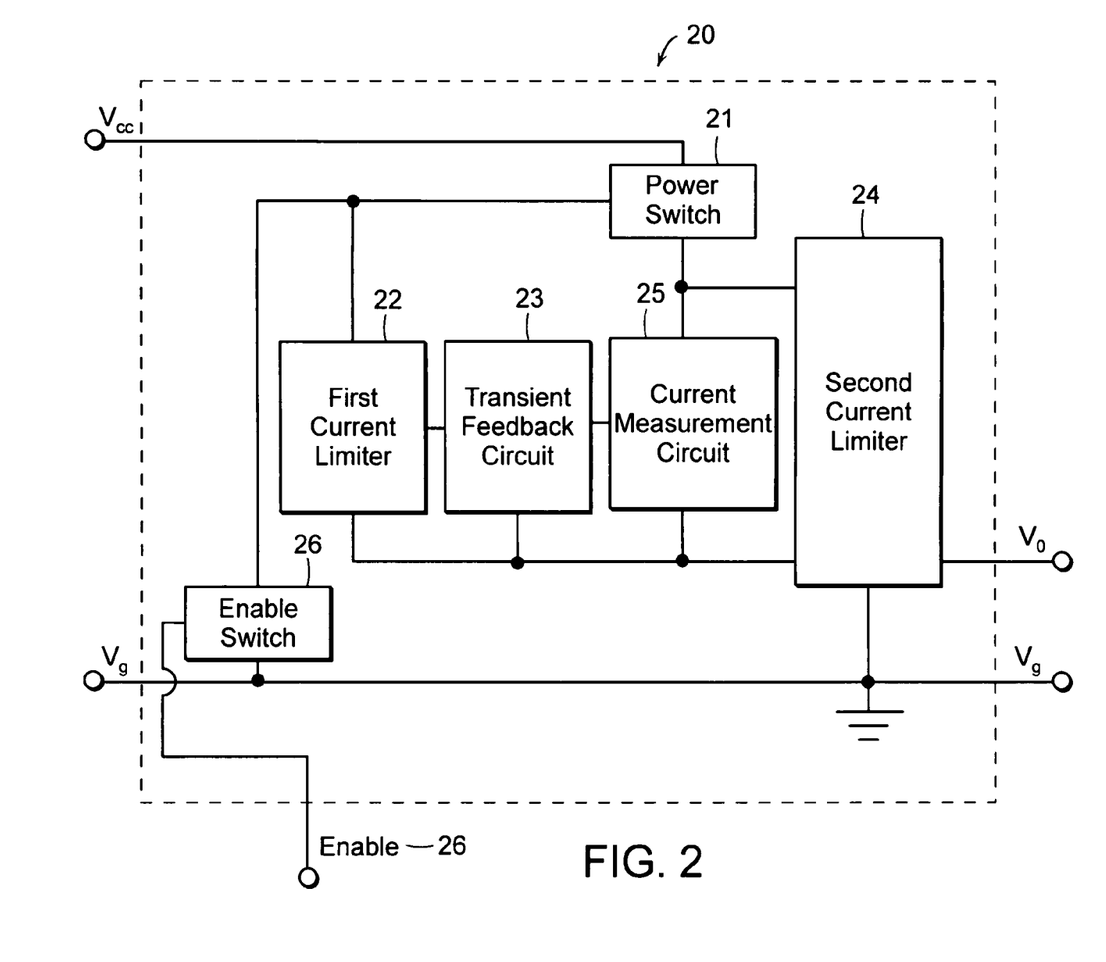
FIG. 2 is a block diagram of an exemplary embodiment of the present invention.

FIG. 2 is a block diagram illustrating a system 20 including an exemplary embodiment of the present invention. This embodiment includes a power switch 21, first and second current-limiting feedback circuits 22, 24, a current measurement circuit 25, a transient feedback circuit 23, and an "enable" switch 26 that changes state based on a state of an enable signal 26. FIGS. 3 and 4 include some or all of the aforementioned circuits, and, thus, operation of the circuits 22, 23, 24, 25, and 26 is described below.

Figure 3A:
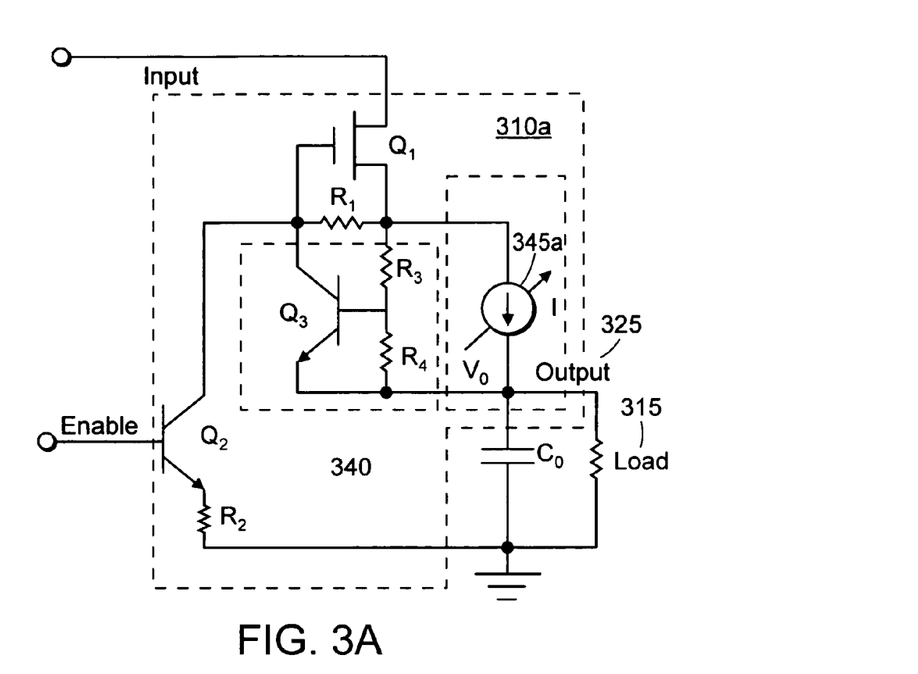
FIG. 3A is a schematic diagram of a circuit featuring an adaptive overload circuit.
Figure 4:
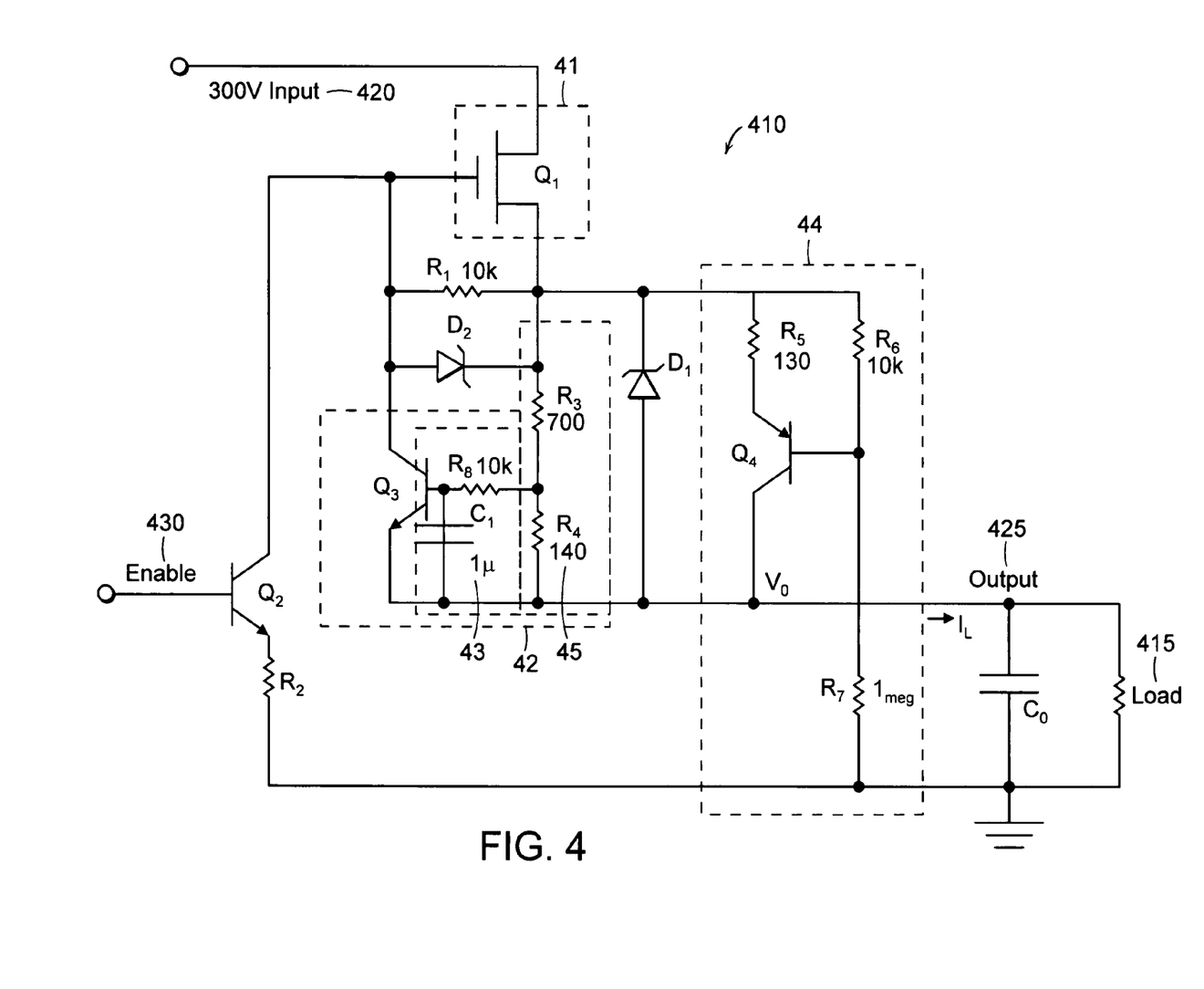
FIG. 4 is a schematic diagram of a circuit with the adaptive overload circuit of FIG. 3B with a transient overload feature.

FIG. 3A illustrates an exemplary embodiment of the present invention. This embodiment includes an adaptable overload circuit 310a that takes advantage of the ability of switch Q1 to safely pass higher currents to the load 315 as the output voltage Vo increases. In this embodiment, a variable current source 1345a is placed in shunt arrangement with resistors R3 and R4 of an overload protection circuit 340. The magnitude of the variable current source increases as the output voltage increases. Theoretically, when the output voltage Vo is zero, the variable current source 1345a is 0 mA. For 100 volts and 200 volts output to a load, the variable current source 1345a is 2.5 mA and 10 mA, respectively, in an example embodiment. For example, if an overload allows the output voltage to be 200 volts, then the current at the output 325 rises to 15 mA (i.e., 10 mA through the variable current source I and 5 mA through resistors R3, R4) before the overload protection circuit 340 activates. Such a result can be accomplished with a complex control circuit, but a much simpler circuit that approximates this adaptable current source may be acceptable in some applications.

Figure 3B:
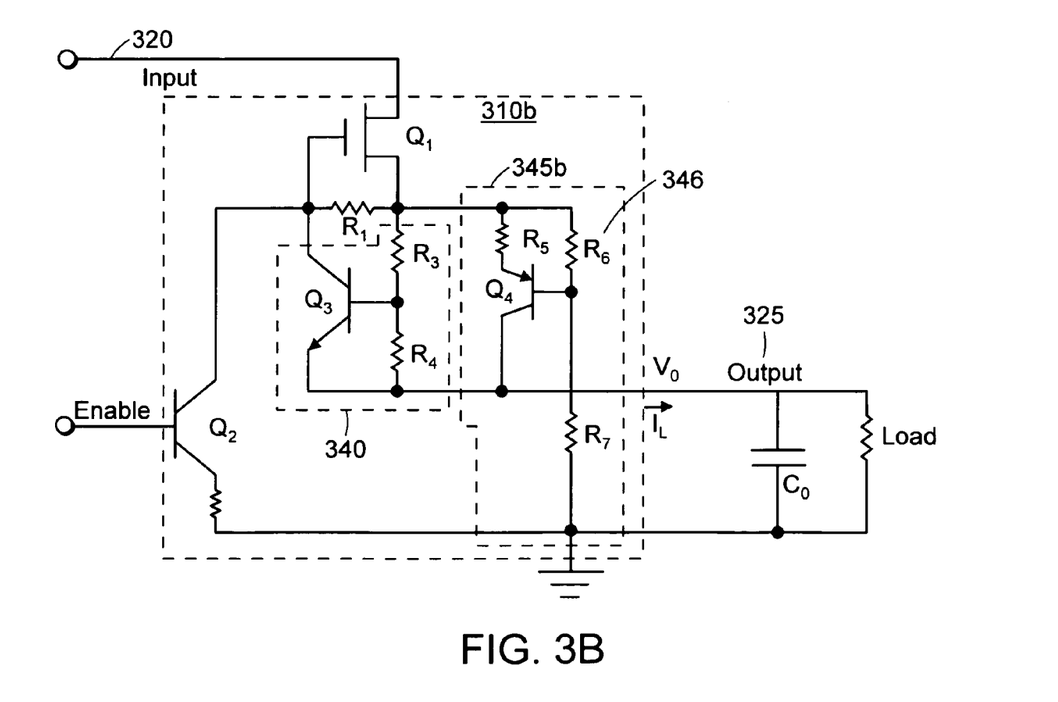
FIG. 3B is a schematic diagram implementing the adaptive overload circuit of FIG. 3A.

FIG. 3B illustrates an embodiment of an adaptive overload circuit 310b having one such simplified variable current circuit 345b. Transistor Q4 and resistor R5 function as a variable current source 345b. Resistors R6 and R7 are a measurement circuit 346 that effectively measures the output voltage Vo and adjusts the base voltage of transistor Q4 to alter its collector current. In one implementation, a ratio of resistor R7 to resistor R6 is approximately 100:1, and the value of resistor R5 is about 130 ohms. For zero output voltage, there is no base-to-emitter voltage on transistor Q4, and thus it conducts no current. For 100 volts out, the voltage across resistor R6 is about 1 volt, and the voltage across R5 is about 0.3 volt, resulting in a current through transistor Q4 of about 2.3 mA, which is close to the desired 2.5 mA in this example. Thus, the overload circuit 310 can allow the current through switch Q1 to rise to 7.3 mA before limiting it. With the output 325 at 200 volts, the voltage across resistor R6 is about 2 volts, and the voltage across resistor R5 is about 1.3 volts. These voltages result in transistor Q4 passing approximately the desired current of 10 mA, and the overload circuit allows the current through switch Q1 to rise to 15 mA before it is limited.

For output voltages above 200 volts, this example overload circuit 345b limits the current through switch Q1 to lower values than what would produce 1.5 watts dissipation in the switch Q1. This circuit effectively limits the maximum power dissipation through switch Q1 to 1.5 watts or less for all overloads, including a "dead" short.

This overload circuit 340 also has a desirable property of having a small voltage drop from input 320 to output 325. When there is full output voltage Vo and normal output current $I_L$ of 10 mA or less, transistor Q4 is saturated. As a result, most all the output $I_L$ current flows through resistor R5, producing a much lower voltage drop than if all the current were forced to flow through the series of resistors R3 and R4. Therefore, the input-to-output voltage drop is typically 1.5 volts or less for normal loads. This exemplary overload circuit 340 limits output current to approximately 17 mA when output voltage Vo is 300 volts.

FIG. 4 illustrates an embodiment of the present invention comprising additional circuitry to improve performance. While the circuit of FIG. 3B is designed to limit power dissipation in switch Q1 to 1.5W for sustained overloads, the switch Q1 may have the ability to withstand very high momentary overloads without damage. The circuit of FIG. 4 features modifications allowing high momentary transient overloads and yet maintains normal sustained overloads.

Resistor R8 and capacitor C1 operate to allow heavy overloads for a limited time as determined by their values. Zener diode D2 is placed to protect the gate of switch Q1 from excessive voltages. It has a forward drop of about 0.7 volts, which is adequate to keep switch Q1, a depletion-mode FET, fully ON. Likewise, the diode D2 has a reverse voltage of about 10 to 12 volts, which maintains the gate-to-source voltage of switch Q1 within safe limits. Zener diode D1 prevents high turn-on currents from creating an excessive voltage across the sensing resistors R3 and R4. Zener diode D1 may be identical to diode D2.

The circuitry of FIG. 4 can be divided into functional blocks. A switch 41 controls connection and disconnection of an output load to the 300V Input. A first current-limiting feedback circuit 42 is coupled to the switch 41 to limit the current through the switch responsive to the current measured through the switch. A second current-limiting feedback circuit 44 is configured to shunt at least some current around the first current-limiting feedback circuit 42 as a function of the voltage delivered to the load 415. The second current-limiting feedback circuit 44 changes the amount of current the switch 41 can deliver to the load 415 by way of the shunting. The first current-limiting feedback circuit 42 may include a current measurement circuit 45 that is coupled to the switch 41 and configured to sense the current through the switch 41. In some embodiments, a transient current-limiting feedback circuit 43, which may be integral with or coupled to the first current-limiting feedback circuit 42, sets a higher momentary current limit for the switch.

A more detailed description of the operation of this overload circuit follows.

When the 300-Volt power supply 105 (FIG. 1) is turned on and the "enable" switch Q2 is opened (i.e., the "enable" switch goes low), the power switch Q1 immediately turns ON. The power switch Q1 can safely dissipate approximately 1.5 watts over a sustained time without damage. Thus, if there is a "dead" short, current through the switch Q1 must be limited to 5 mA because there is 300 volts across switch Q1. The safe current limit is a function of the voltage differential across switch Q1, and, therefore, also a function of the output voltage Vo.

When power is to be turned on, the enable signal 430 goes low, turning off switch Q2, which then turns ON the power switch Q1 to begin ramping the output 425 to the load 415. Transistor Q3 may be a depletion-mode FET, which is ON (i.e., low resistance between drain and source) with zero volts between the gate and source. Resistor R1 is sized such that when switch Q2 is off but has maximum leakage, the voltage across R1 is less than 1 volt. For switch Q1 to turn off, its gate must be pulled at least 3.5 volts below the source. Switch Q2 operates as a constant-current source of about 5.5 mA when on, so the voltage across R1 must be greater than about 3.5 volts to fully turn OFF switch Q1. Zener diode D2 prevents the gate from falling more than 10 volts below the source under all transient conditions in order to protect the gate of switch Q1.

The circuit 410 of FIG. 4 includes a first current-limiting feedback circuit 42, which includes transistor Q3 and resistors R3, R4 and a second current-limiting feedback circuit 44, which includes transistor Q4 and resistors R5-R7. When the output voltage Vo is near ground (i.e., the load 415 is near short), nearly all the output current from switch Q1 flows through resistors R3 and R4 because transistor Q4 is off. Resistor R4 is sized such that when about 5 mA flows through it, there is about 0.67 volts generated at the base of transistor Q3, which turns it on. With 5 mA, the combined voltage across R3 and R4 is about 4.8 volts. Thus, when transistor Q3 turns on due to load currents above 5 mA, transistor Q3 turns ON just enough to pull the gate of switch Q1 low enough to maintain its source current at 5 mA. Thus, the circuit 42 comprising transistor Q3 and current-measuring resistors R3, R4 effectively limits current through the power switch Q1 to 5 mA for a short-circuit or other overload event.

A high-voltage load 415 may require more current than the 5 mA limited current through resistors R3, R4. In such a case, a second current-limiting circuit 44 comprising resistors R5, R6, R7 and transistor Q4 may provide additional current output $I_L$ to the load 415. As the output voltage Vo rises, transistor Q4 shunts current away from resistors R3, R4 so that the total load current through the power switch Q1 can be greater than 5 mA before the first current-limiting circuit 42 senses overload. When the output 425 reaches full voltage (300 V), transistor Q4 is saturated, and nearly all the load current $I_L$ flows through the 133-ohm resistor R5. At this point, switch Q1 is fully ON and its source voltage (i.e., voltage at Q1-source) is nearly equal to the 300 V input 420. The second current-limiting feedback circuit 44 also produces a lower voltage drop between the 300 V at Q1-source and the output 425. For example, a load current of 9.5 mA results in a source-to-output voltage drop of less than 1.3 volts. Under ideal conditions, while the power switch Q1 is ON, the circuit 410 may ensure that voltage drop from input 420 to output 425 never exceeds 1.5 volts.

During startup, when output capacitance is being charged, and during momentary overloads, it may be desirable to prevent the first current-limiting feedback circuit 42 from operating. A transient feedback circuit 43, comprising resistor R8 and capacitor C1, provides a momentary delay in turning on transistor Q3 in order to accommodate transient load situations. The 10-volt zener diode D1 prevents excessive transient voltages across resistors R3 and R4, which may occur during startup.

During normal operation, there is approximately a continuous 300 volts across resistor R7. Rather than allowing this high voltage gradient to be across only one resistor, the resistor R7 may alternatively be replaced by a series of multiple resistors, so as to reduce the voltage gradient and improve reliability. For example, a series of three resistors, each of 316 k-Ohms resistance, may be alternatively employed in place of a 1 Mohm resistor R7 to reduce the voltage gradient while drawing approximately 0.3 mA current from the Input 420.

During shutdown, the enable signal 430 goes low, turning on switch Q2, which in turn shuts off power switch Q1. At this moment, the input and output voltages 420, 425 are separated and the output voltage Vo is momentarily maintained by the output capacitor $C_O$ while it discharges. The output voltage Vo decrease may be further controlled by additional circuitry (not shown).

Circuits as depicted in FIGS. 3 and 4 may be cost-effective in some embodiments employing few, inexpensive, low-power parts. Moreover, such embodiments may be temperature sensitive, effectively limiting power dissipation at higher temperatures by reducing the load current required to forward-bias the base-emitter of transistor Q3. Embodiments of the present invention provide an efficient system for overload protection of power-switching circuits, where performance is improved by adapting the output to specific tolerances of the switch and ensuring minimal voltage drop across the circuit.

Figure 5:
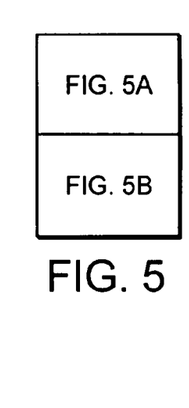
FIG. 5 is a state diagram depicting operation of the circuit of FIG. 4.
Figure 5A:
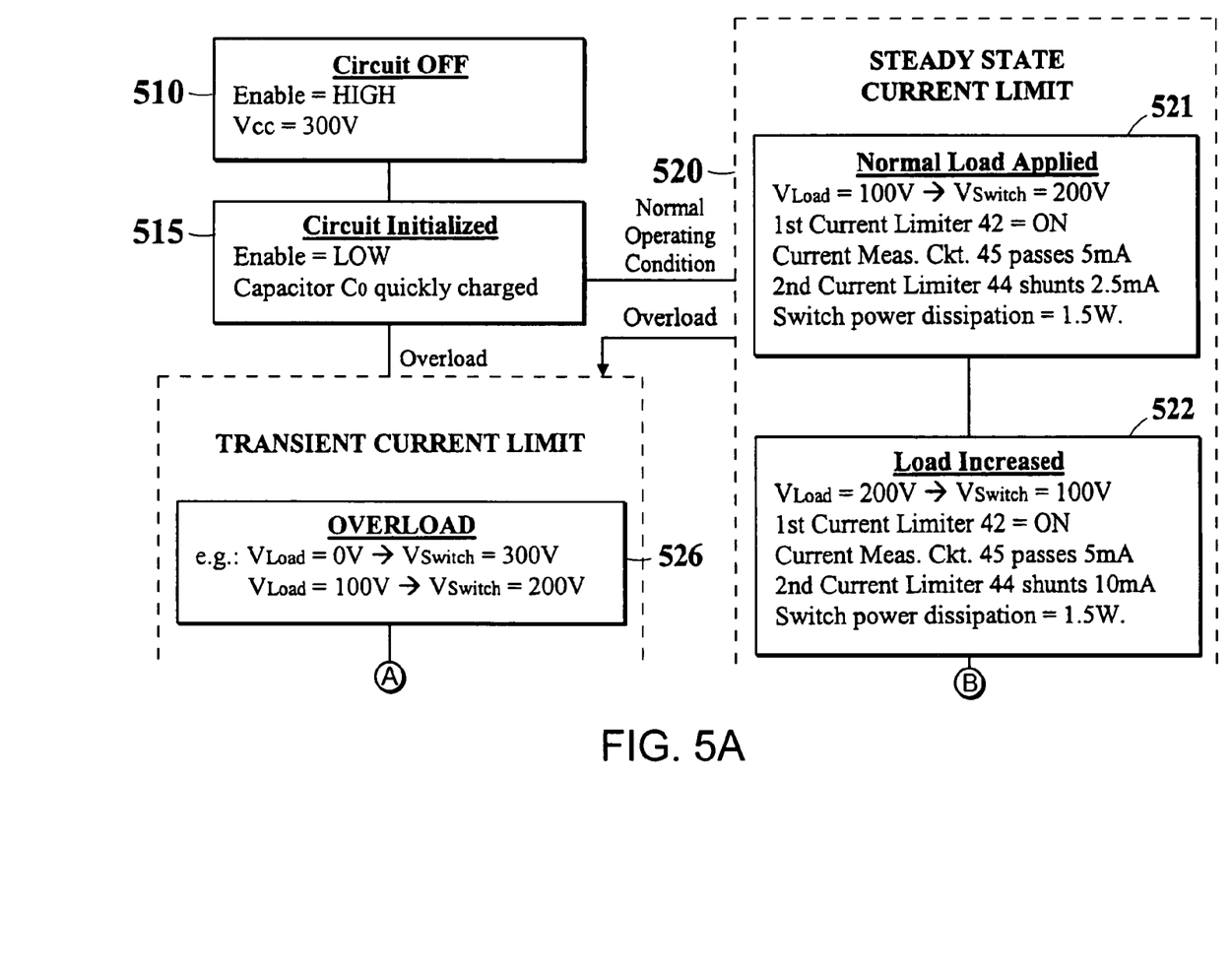
Figure 5B:
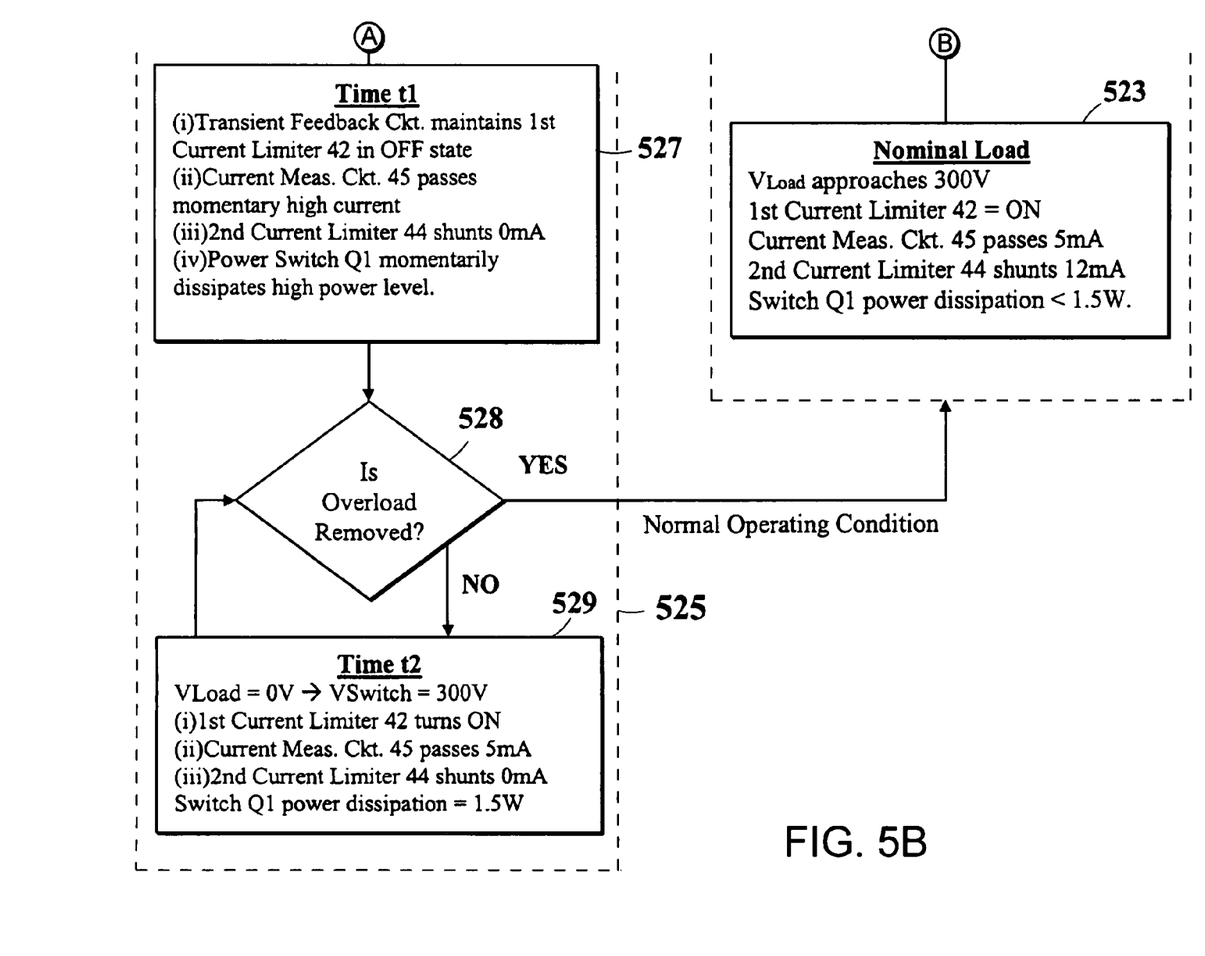

FIG. 5 is a state diagram illustrating a number of operations of the circuit 410 of FIG. 4. These operations include those under steady-state loads and transient overloads, are described in detail above. Referring to FIG. 5 with reference to FIG. 4, prior to initialization, the circuit 410 is OFF (510) and the enable signal is high (i.e., switch Q2 closes, which, in turn, pulls the gate of switch Q1 low), thereby preventing current from passing through the switch Q1 to a load 415. During initialization 515, the enable switch Q2 is driven OFF, allowing current to flow through the power switch Q1 and quickly charge the load capacitor $C_O$.

For normal steady-state applied loads, the circuit 410 enters steady-state operation 520. In steady-state operation, power dissipation is maintained at no greater than 1.5 Watts.

Steady-state operation 520 is illustrated by three states 521, 522, 523, which are exemplary and represent approximate results of applying distinct loads. During actual operation, current through the circuit 410 may change as a function of the applied load 415. The three exemplary steady-state states 521, 522, 523 illustrate a result of the operation of the circuit 410, namely that the second current limiter 44 shunts more current as the load voltage increases. Likewise, the second current limiter 44 shunts less current in response to a decrease in voltage across the load 415. As a result, current through the circuit 410 may be maximized while maintaining a safe continuous power dissipation through the switch Q1.

When an overload condition initially occurs (526), the circuit 410 enters transient operation 525. In response to the overload condition, the circuit 410 momentarily passes a very high current from time=0 through time=t1 527, causing power dissipation through the power switch Q1 that is higher than the safe limit for continuous operation. If the overload is removed, the circuit 410 either transitions to steady-state operation 520 as a function of the applied load, or returns to an initialized state 515 if no load remains. If the overload persists beyond time t1, the transient circuit 43 allows the overload circuits 42, 44 to operate as though the transient circuit were not present, and the current through the switch Q1 transitions as defined by the state of the circuit 410 at time t2 529. In this state 529, the first current limiter 42 turns ON, limiting the current passing through the power switch Q1 to 5 mA. The circuit 410 remains in this state 529 until the overload is removed, at which time the circuit 410 transitions back to an initialization state 515 (short removed) or steady-state operation 520.

While this invention has been particularly shown and described with references to preferred embodiments thereof, it will be understood by those skilled in the art that various changes in form and details may be made therein without departing from the scope of the invention encompassed by the appended claims. For example, the circuitry of FIGS. 2, 3A, 3B, 4 may include additional circuitry, different circuitry, or equivalent circuitry and still achieve the overload protection described herein. The state diagram of FIG. 5 is exemplary. Additional, fewer, or equivalent states may be used to represent the operating conditions associated with the switch/overload protection circuits of FIGS. 2, 3A, 3B or 4.

What is claimed is:

1. An apparatus for overload protection, comprising:
   a switch configured to be coupled to a path delivering a current and a voltage to a load;
   a first current-limiting feedback circuit coupled to the switch to limit current through the switch responsive to current measured through the switch; and
   a second current-limiting feedback circuit configured to shunt at least some of the current to the load around the first current-limiting feedback circuit as a function of the voltage delivered to the load to change the amount of current the switch can deliver to the load.

2. The apparatus of claim 1 further comprising a transient current limiting feedback circuit, coupled to the first current limiting feedback circuit, that sets a higher momentary current limit for the switch.

3. The apparatus of claim 1 wherein the first current-limiting feedback circuit comprises a current measurement circuit coupled to the switch in a configuration sensing the current through the switch.

4. The apparatus of claim 3 wherein the second current limiting feedback circuit shunts the at least some current around the current measurement circuit.

5. The apparatus of claim 1 wherein the first and second current-limiting feedback circuits limit maximum power dissipation of the switch to a level that is protective of the switch.

6. The apparatus of claim 1 wherein the at least some current shunted by the second current-limiting feedback circuit is a function of the voltage delivered to the load.

7. The apparatus of claim 1 wherein the at least some current shunted by the second current-limiting feedback circuit is a function of the voltage differential across the switch.

8. The apparatus of claim 1 wherein the second current-limiting feedback circuit experiences a voltage differential that is lower than the voltage differential across the first current-limiting feedback circuit for a given output voltage to the load.

9. The apparatus of claim 1 wherein the second current-limiting feedback circuit includes a circuit operating as a variable current source.

10. The apparatus of claim 9 wherein the second current-limiting feedback circuit further includes a measurement circuit, coupled to the variable current source, that measures the voltage delivered to the load and adjusts current through the variable current source as a function of the voltage.

11. The apparatus of claim 1 wherein the first current-limiting feedback circuit further reduces power dissipation of the switch at higher temperatures as a function of circuit temperature.

12. The apparatus of claim 1 wherein the first and second current-limiting feedback circuits limit maximum sustained power dissipation of the switch to a level that is protective of the switch.

13. A method for ensuring overload protection, comprising:
   measuring current through a switch on a path delivering a current and a voltage to a load;
   limiting current through the switch responsive to current measured through the switch; and
   shunting at least some of the current to the load as a function of the voltage delivered to the load via the switch in a manner changing the amount of current the switch can deliver to the load.

14. The method of claim 13 further comprising setting a momentary current limit for the switch that is higher than the continuous current limit for the switch.

15. The method of claim 13 wherein the limiting and shunting limit maximum power dissipation of the switch to a level that is protective of the switch.

16. The method of claim 13 wherein shunting at least some of the current is a function of the voltage differential across the switch.

17. The method of claim 13 wherein the shunting results in a lower voltage drop than the voltage drop resulting from measuring the current through the switch for some output voltage.

18. The method of claim 13 further comprising measuring the voltage delivered to the load.

19. The method of claim 13 further comprising reducing power dissipation of the switch at higher temperatures as a function of temperature.

20. An apparatus for overload protection, comprising:
   a switch configured to be coupled to a path delivering a current and a voltage to a load;

means for limiting current through the switch responsive to current measured through the switch; and means for shunting at least some of the current to the load as a function of the voltage delivered to the load, said means changing the amount of current the switch can deliver to the load by shunting the at least some current.

* * * * *